US009419036B2

(12) United States Patent
Saitou (10) Patent No.: US 9,419,036 B2
(45) Date of Patent: Aug. 16, 2016

(54) SOLID-STATE IMAGING DEVICE (71) Applicant: Panasonic Intellectual Property Management Co., Ltd., Osaka (JP)

(72) Inventor: Shigeru Saitou, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/686,068

(22) Filed: Apr. 14, 2015

(65) Prior Publication Data

US 2015/0221693 A1  Aug. 6, 2015

Related U.S. Application Data

(63) Continuation of application No. PCT/JP2013/001611, filed on Mar. 12, 2013.

(30) Foreign Application Priority Data

Oct. 18, 2012  (JP) .................................. 2012-230763

(51) Int. Cl.
*H01L 27/00* (2006.01)
*H01L 31/00* (2006.01)
(Continued)

(52) U.S. Cl.
CPC .... *H01L 27/14627* (2013.01); *H01L 27/14629* (2013.01); *H01L 27/14645* (2013.01); *H01L 31/0232* (2013.01)

(58) Field of Classification Search
CPC .................. H01L 27/14625; H01L 27/14627; H01L 27/14645; H01L 31/0232
See application file for complete search history.

(56) References Cited

U.S. PATENT DOCUMENTS 6,590,270 B2   7/2003  Suzuki
8,384,818 B2   2/2013  Hiramoto et al.
(Continued)

FOREIGN PATENT DOCUMENTS

JP        11-313334       11/1999
JP       2001-309395      11/2001
(Continued)

OTHER PUBLICATIONS

International Search Report (ISR) issued Jun. 11, 2013 in International (PCT) Application No. PCT/JP2013/001611.

*Primary Examiner* — Su C Kim
*Assistant Examiner* — David S Wilbert
(74) *Attorney, Agent, or Firm* — Wenderoth, Lind & Ponack, L.L.P.

(57) ABSTRACT

A solid-state imaging device includes: light-receiving elements; and first dispersive elements on a light-incident side of the light-receiving elements. Each first dispersive element includes first and second light transmissive film materials. The second light transmissive film material has a refractive index that is lower than that of the first light transmissive film material in a first wavelength range and higher than that of the first light transmissive film material in a second wavelength range longer in wavelength than the first wavelength range. A volume occupation ratio of the first light transmissive film material in each dispersive element increases from one end towards the other end of the dispersive element in a direction parallel to a light-receiving surface, while a volume occupation ratio of the second light transmissive film material in the dispersive element increases from the other end towards the one end in the direction.

19 Claims, 9 Drawing Sheets

(51) Int. Cl.
*H01L 27/146* (2006.01)
*H01L 31/0232* (2014.01)

(56) References Cited

U.S. PATENT DOCUMENTS

| | | | |
|---|---|---|---|
| 8,792,027 B2 | 7/2014 | Yamagata et al. | |
| 2002/0005471 A1* | 1/2002 | Suzuki | H01L 27/14625 250/208.1 |
| 2004/0211884 A1* | 10/2004 | Fang | H01L 27/14601 250/214.1 |
| 2010/0187501 A1* | 7/2010 | Toda | B82Y 20/00 257/21 |
| 2010/0188537 A1 | 7/2010 | Hiramoto et al. | |
| 2011/0267487 A1 | 11/2011 | Yamagata et al. | |

FOREIGN PATENT DOCUMENTS

| | | |
|---|---|---|
| JP | 4435606 | 3/2010 |
| JP | 2011-159967 | 8/2011 |
| WO | 2009/153937 | 12/2009 |

\* cited by examiner

Blue light
(wavelength of 450 nm)

FIG. 3B

Green light
(wavelength of 525 nm)

FIG. 3C

Red light
(wavelength of 600 nm)

First pixel array

FIG. 5B

Second pixel array

SOLID-STATE IMAGING DEVICE

CROSS REFERENCE TO RELATED APPLICATIONS

This is a continuation application of PCT Patent Application No. PCT/JP2013/001611 filed on Mar. 12, 2013, designating the United States of America, which is based on and claims priority of Japanese Patent Application No. 2012-230763 filed on Oct. 18, 2012. The entire disclosures of the above-identified applications, including the specifications, drawings and claims are incorporated herein by reference in their entirety.

FIELD

The present disclosure relates to solid-state imaging devices used in digital cameras and the like.

BACKGROUND

Recently, with the popularization of digital cameras, mobile phones with camera function, and the like, the market of solid-state imaging devices has significantly been expanded. Increase in resolution achieved by cell-size miniaturization dramatically improves image quality of cameras.

In such a solid-state imaging device, for example, a charge-coupled device (CCD) or metal-oxide-semiconductor (MOS) image sensor, a plurality of pixels having light-receiving portions are two-dimensionally arrayed to convert incident light traveled from an object into electrical signals. Sensitivity of the solid-state imaging device is defined by a magnitude of the electrical signals which are outputted from light-receiving elements according to an amount of the incident light. It is therefore important to guide the incident light certainly to reach the light-receiving elements to improve the sensitivity.

In each pixel in the conventional common solid-state imaging devices, light incident on a microlens passes through a color filter, which is a red filter (R), a green filter (G), or a blue filter (B), for color separation and then converted by a light-receiving portion to electrical signals.

However, such a conventional common color filter absorbs the incident light except transmitted light. Therefore, approximately only 25% of the incident light can be converted to electrical signals. In short, light use efficiency is low. Therefore, the solid-state imaging device with such conventional absorptive color filters has a difficulty of improving light use efficiency.

In order to solve the above problem, as disclosed in Patent Literature (PTL) 1, there has been proposed a technique in which a medium having a refractive index that periodically varies is used as a dispersive element so as to improve light use efficiency of a solid-state imaging device. According to this technique, incident light is dispersed to different wavelength bands, and the dispersed lights are guided to respective corresponding light-receiving portions to be converted to electrical signals. As a result, light use efficiency is improved in comparison with the conventional method using color filters.

CITATION LIST

Patent Literature

[PTL 1] Japanese Unexamined Patent Application Publication No. 2011-159967

SUMMARY

However, the solid-state imaging device using the technique disclosed in PTL 1 disperses light by light diffraction effects. In general, in light diffraction, light is dispersed into a zero-order light, a first-order light, a second-order light, . . . . Therefore, light use efficiency is decreased. Furthermore, if a cell size is miniaturized, a diffraction grating cannot be used. The reason is as follows. Since physical phenomenon of diffraction occurs due to a periodic structure of wavelength orders, the diffraction grating needs to be large enough for the periodicity, which prevents size miniaturization of the diffraction grating.

In order to address the above-described problems, an object of the present disclosure is to provide a solid-state imaging device with high light use efficiency and high sensitivity.

In accordance with an aspect of the present invention for solving the above problems, there is provided a solid-state imaging device comprising: a plurality of light-receiving elements each of which photoelectrically converts incident light; and a plurality of dispersive elements disposed on a light-incident side of the light-receiving elements, wherein each of the dispersive elements includes: a first light transmissive film material; and a second light transmissive film material with a property of having a refractive index that is lower than a refractive index of the first light transmissive film material in a first wavelength range of the incident light and higher than the refractive index of the first light transmissive film material in a second wavelength range of the incident light, the second wavelength range being longer in wavelength than the first wavelength range, and a volume occupation ratio of the first light transmissive film material in the each of the dispersive elements increases from one end of the each of the dispersive elements towards an other end of the each of the dispersive elements in a direction parallel to a light-receiving surface of the light-receiving elements, while a volume occupation ratio of the second light transmissive film material in the each of the dispersive elements increases from the other end towards the one end in the direction, the other end being opposite the one end.

According to the solid-state imaging device of the present disclosure, red light, blue light, and green light are refracted in a dispersive element to reach respective corresponding light-receiving elements. As a result, the solid-state imaging device according to the present disclosure is capable of improving light use efficiency.

DETAILED DESCRIPTION

The following describes embodiments of the present disclosure in more detail with reference to the Drawings. Although the embodiments below and the appended Drawings are referred to in the description of the solid-state imaging device according to the present disclosure, they are merely examples and do not limit the solid-state imaging device according to the present disclosure.

First Embodiment

Figure 1:
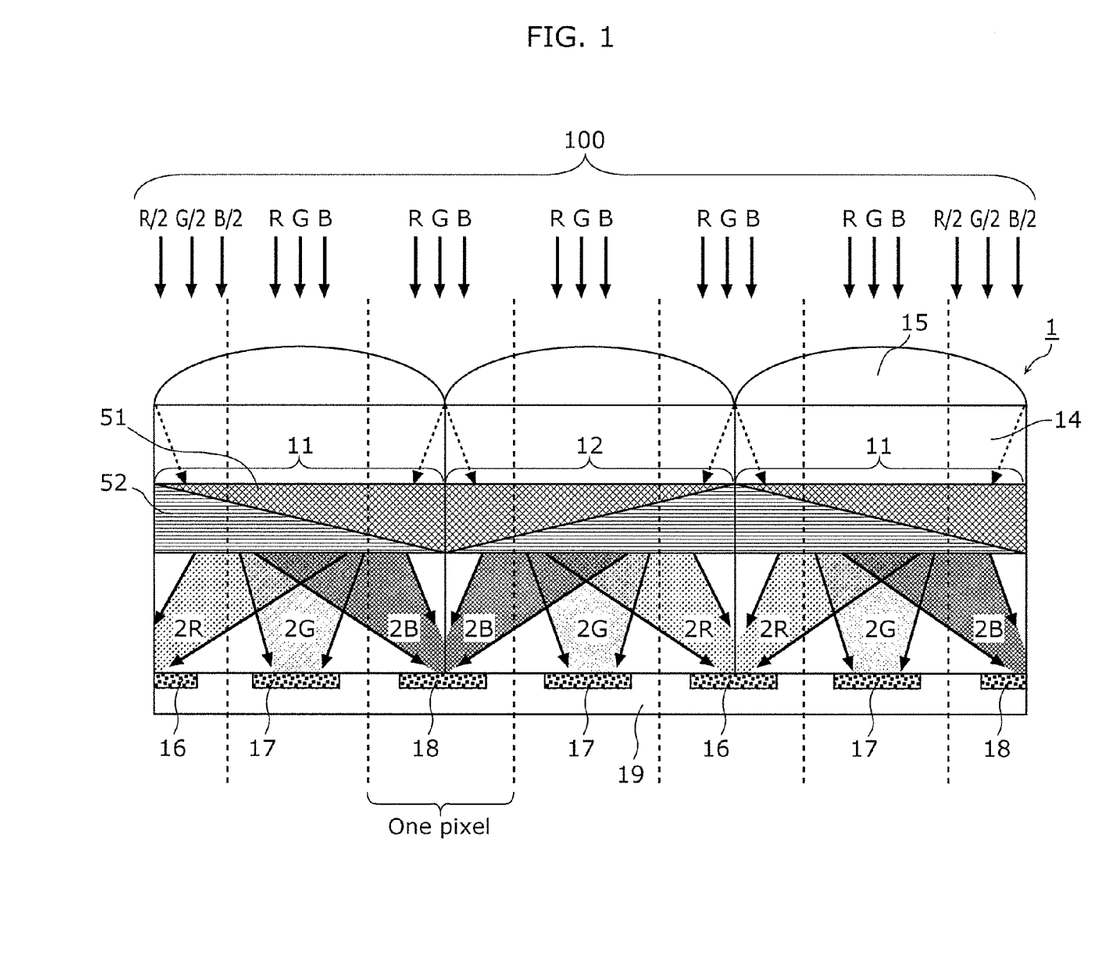
FIG. 1 is a cross-sectional view of a plurality of pixels arrayed in a solid-state imaging device according to a first embodiment.

FIG. 1 is a cross-sectional view of a plurality of pixels arrayed in a solid-state imaging device according to the first embodiment. A solid-state imaging device 1 according to a first embodiment includes: a semiconductor substrate 19; first dispersive elements 11; second dispersive elements 12; an insulating film 14 disposed above these dispersive elements; microlenses 15 disposed above the insulating film 14 to prevent color mixture; first light-receiving elements 16 that absorb red light; second light-receiving elements 17 that absorb green light; and third light-receiving elements 18 that absorb blue light. The first dispersive elements 11 and the second dispersive elements 12 are alternately arranged to be adjacent to one another. A length of one side of each of the dispersive elements is substantially equal to a diameter of each of the microlenses 15. The "substantially equal" means that variations occurred in manufacturing are included.

Each of the first light-receiving elements 16 absorbs, from incident light 100, red light received through a microlens 15 and a first dispersive element 11 and red light received through a microlens 15 and a second dispersive element 12, and converts the absorbed red light to electrical signals. Each of the second light-receiving elements 17 absorbs, from the incident light 100, green light received through a microlens 15 and a first or second dispersive element 11 or 12, and converts the absorbed green light to electrical signals. Each of the third light-receiving elements 18 absorbs, from the incident light 100, blue light received through a microlens 15 and a first dispersive element 11 and blue light received through a microlens 15 and a second dispersive element 12, and converts the absorbed blue light to electrical signals.

In the conventional solid-state imaging devices, one microlens is provided to each pixel. In the solid-state imaging device 1 according to the first embodiment, however, one microlens 15 covers parts of adjacent pixels. If an amount of the incident light on each pixel is expressed as (R, G, B), a single microlens 15 is capable of collecting light of a double amount (2R, 2G, 2B) because one microlens 15 has an area equivalent to two pixels in the planar view. Here, R represents an amount of red light in the incident light, G represents an amount of green light in the incident light, and B represents an amount of blue light in the incident light. It should be noted that the "planar view" in this description refers to the situation where the solid-state imaging device is viewed from a normal direction of the light-receiving surface.

The first dispersive elements 11 and the second dispersive elements 12 are disposed between the microlenses 15 and the above-described light-receiving elements. In other words, the first dispersive elements 11 and the second dispersive elements 12 are disposed on the light-incident side of the light-receiving elements. Each of the first dispersive elements 11 and the second dispersive elements 12 includes a first light transmissive film material 51 having first wavelength dispersion properties and a second light transmissive film material 52 having second wavelength dispersion properties. In each of the first dispersive elements 11 and the second dispersive elements 12, volume occupation ratios of the first light transmissive film material 51 and the second light transmissive film material 52 vary in the direction parallel to the light-incident surface. More specifically, a volume occupation ratio of the first light transmissive film material 15 in each dispersive element increases from one end of the dispersive element towards the other end of the dispersive element which is opposite the one end in the direction parallel to the light-receiving surface, while a volume occupation ratio of the second light transmissive film material 52 in the dispersive element increases from the other end towards the one end in the direction parallel to the light-receiving surface.

As illustrated in FIG. 1, in the solid-state imaging device 1 according to the first embodiment, each of the second dispersive elements 12 is adjacent to a first dispersive element 11 in the above-described direction parallel to the light-receiving surface. In each of the first dispersive elements 11 and the second dispersive elements 12, the first light transmissive film material 51 is stacked above the second light transmissive film material 52. In the description, "above" expresses an arrangement viewed in the direction from the semiconductor substrate 19 to the microlenses 15 to consider that the microlenses 15 is located higher than the semiconductor substrate 19. In other words, the first light transmissive film material 51 is stacked on the light-incident side of the second light transmissive film material 52. Furthermore, the first dispersive elements 11 and the second dispersive elements 12 are arranged, so that (a) a set of a first light transmissive film material 51 and a second light transmissive film material 52 which are included in a first dispersive element 11 and (b) a set of a first light transmissive film material 51 and a second light transmissive film material 52 which are included in a second dispersive element 12 adjacent to the first dispersive element 11 are symmetric with respect to a boundary between the first dispersive element 11 and the second dispersive element which are adjacent to each other. The boundary is a plane including the normal of the light-receiving surface. It should be noted that the first light transmissive film material 51 and the second light transmissive film material 52 in each of the dispersive elements are arranged in the same manner on any cross-sectional surface taken along the depth direction of FIG. 1.

Next, properties of the first light transmissive film material 51 and properties of the second light transmissive film material 52 are described.

The first light transmissive film material 51 mainly includes wavelength dispersion properties that a refractive index for red light is lower than a refractive index for green light which is lower than a refractive index for blue light.

On the other hand, the second light transmissive film material 52 mainly includes wavelength dispersion properties that a refractive index for red light, a refractive index for green light, and a refractive index for blue light are substantially equal to one another, and also substantially equal to the refractive index of the first light transmissive film material 51 for green light. In the description, the expression that refractive indices are "substantially equal" means that a difference among the refractive indices is within 0.1.

In other words, the second light transmissive film material 52 mainly includes properties of having a refractive index that is lower than the refractive index of the first light transmissive film material 51 in a first wavelength range corresponding to blue light and higher than the refractive index of the first light transmissive film material 51 in a second wavelength range corresponding to red light. Here, the second wavelength range is longer in wavelength than the first wavelength range.

Next, the description is given to explain how the first dispersive element 11 separates the incident light 100 into red light, blue light, and green light when the incident light 100 is incident on the surface of the solid-state imaging device 1 according to the first embodiment. In the description, a wavelength range corresponding to blue light ranges from approximately 450 nm to approximately 490 nm, a wavelength range corresponding to red light ranges from approximately 600 nm to approximately 750 nm, and a wavelength range corresponding to green light ranges from approximately 490 nm to approximately 580 nm. It should be noted that principles of color separation in the second dispersive element 12 are the same as the principles of the first dispersive element 11.

First, how red light passes through the first dispersive element 11 in the solid-state imaging device 1 will be described. On an interface between the first light transmissive film material 51 and the second light transmissive film material 52, incident light is bent closer to a portion with a higher refractive index according to Snell's law. For red light, a refractive index of the second light transmissive film material 52 is higher than a refractive index of the first light transmissive film material 51, so that red light in the incident light is refracted towards a portion with a higher volume occupation ratio of the second light transmissive film material 52 in the first dispersive element 11. The above principles and the arrangement of the light-receiving element illustrated in FIG. 1 guide the red light passing through the first dispersive element 11 to reach a first light-receiving element 16 disposed under the portion with the higher volume occupation ratio of the second light transmissive film material 52.

Next, how blue light passes through the first dispersive element 11 in the solid-state imaging device 1 will be described. For blue light, a refractive index of the first light transmissive film material 51 is higher than a refractive index of the second light transmissive film material 52, so that blue light in the incident light is refracted towards a portion with a higher volume occupation ratio of the first light transmissive film material 51 in the first dispersive element 11 according to Snell's law. The above principles and the arrangement of the light-receiving element illustrated in FIG. 1 guide the blue light passing through the first dispersive element 11 to reach a third light-receiving element 18 disposed under the portion with the higher volume occupation ratio of the first light transmissive film material 51.

Finally, how green light passes through the first dispersive element 11 in the solid-state imaging device 1 will be described. Since the first light transmissive film material 51 and the second light transmissive film material 52 have substantially the same refractive indices for green light, green light in the incident light is not refracted but travels straightforward. The above principles and the arrangement of the light-receiving element illustrated in FIG. 1 guide the green light passing through the second dispersive element 12 to reach a second light-receiving element 17 disposed under a portion where the first light transmissive film material 51 and the second light transmissive film material 52 have substantially the same volume occupation ratio.

The first dispersive element 11 and the second dispersive element 12 are arranged symmetric with respect to their boundary plane that includes the normal of the light-receiving surface. Therefore, the color separation properties of the first dispersive element 11 and the color separation properties of the second dispersive element 12 are also symmetric with respect to the boundary plane. Furthermore, the first dispersive elements 11 and the second dispersive elements 12 are alternately arranged to be adjacent to each other.

With the structure as illustrated in FIG. 1, both red light refracted in a first dispersive element 11 and red light refracted in a second dispersive element 12 reach the same first light-receiving element 16. Furthermore, both blue light refracted in a first dispersive element 11 and blue light refracted in a second dispersive element 12 reach the same third light-receiving element 18. The dispersion of the incident light 100 which is caused by refraction in the dispersive elements reduces a loss in light collection in comparison with light dispersion caused by diffraction. This is because while diffraction causes light distribution up to high-order zones, such as zero order, first order, second order, third order, . . . , refraction without such high-order zones can reduce the loss in light collection caused by the high-order zones. As the light collection loss is decreased, light use efficiency increases and eventually sensitivity of the solid-state imaging device 1 according to the present embodiment increases. Furthermore, an angle for color separation can also be controlled by a difference in refractive index between dispersive elements. If a distance between each pair of adjacent light-receiving elements is equal, setting a larger angle for color separation results in a shorter distance between a light-receiving element and a dispersive element. In short, the height of the solid-state imaging device 1 can be decreased.

As described above, the structure having the dispersive elements and the microlenses as illustrated in FIG. 1 allows all the incident light 100 to be guided to the light-receiving elements, thereby significantly increasing sensitivity of the solid-state imaging device 1 in comparison with the conventional solid-state imaging devices having absorptive color filters.

It should be noted that even if the second light transmissive film material 52 is stacked above the first light transmissive film material 51, the same effects as above can be produced. In this case, in comparison with the structure illustrated in FIG. 1, a direction of refracting red light and a direction of refracting blue light are opposite. Therefore, the position of the first light-receiving element 16 and the position of the third light-receiving element 18 are switched.

Figure 2:
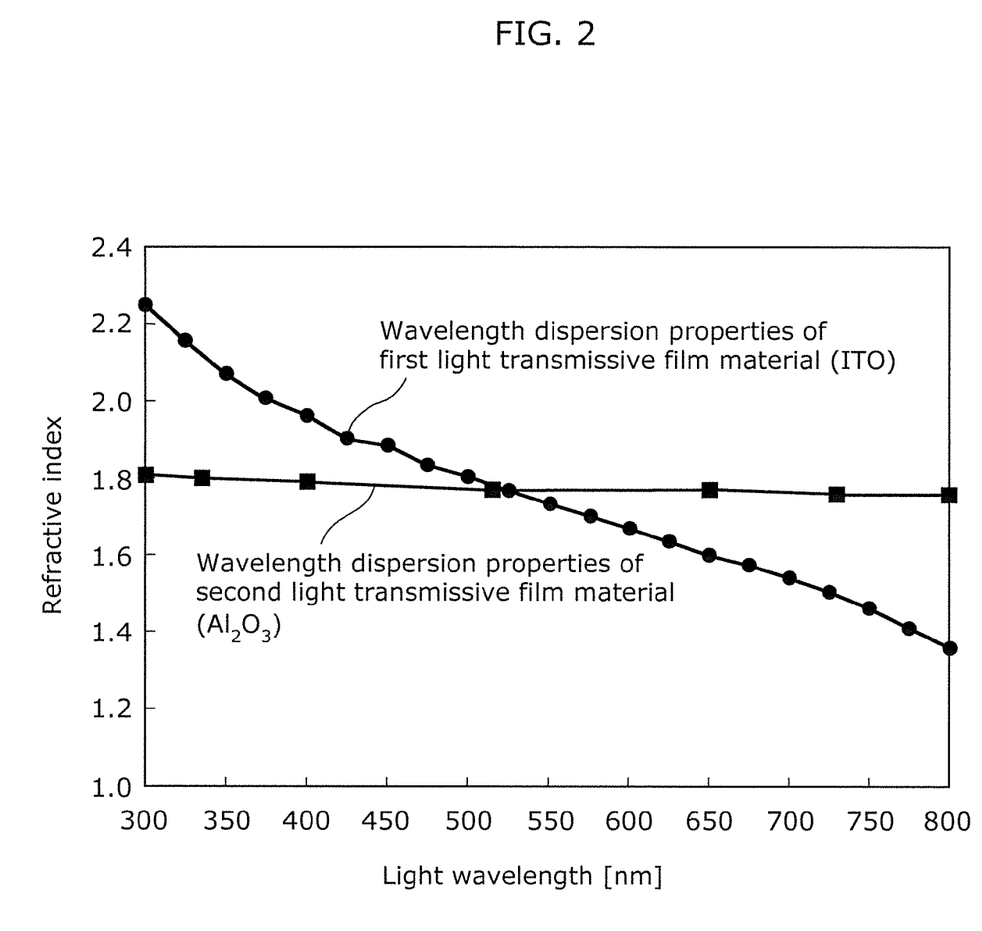
FIG. 2 is a graph plotting wavelength dispersion properties of a first light transmissive film material and a second light transmissive film material according to the first embodiment.

Next, the description is given for wavelength dispersion properties of the first light transmissive film material 51 and wavelength dispersion properties of the second light transmissive film material 52 according to the first embodiment with reference to FIG. 2.

FIG. 2 is a graph plotting wavelength dispersion properties of the first light transmissive film material and wavelength dispersion properties of the second light transmissive film material according to the first embodiment. In the graph, the horizontal axis represents a wavelength of incident light, and the vertical axis represents a refractive index of the light transmissive film materials. More specifically, FIG. 2 shows first wavelength dispersion properties of the first light transmissive film material 51 comprising indium tin oxide (ITO) and second wavelength dispersion properties of the second light transmissive film material 52 comprising aluminum oxide ($Al_2O_3$). It should be noted that the materials comprised in the first light transmissive film material 51 and the second light transmissive film material 52 are not limited to the above examples. Materials rather than the above examples are also possible as long as they have the same wavelength dispersion properties as those seen in FIG. 2. For example, the second light transmissive film material 52 may be silicon oxynitride (SiON), silicon oxide ($SiO_2$), or silicon nitride (SiN).

As seen in FIG. 2, as the wavelength of the incident light is longer, the refractive index of the first light transmissive film material 51 decreases. Furthermore, the refractive index of the second light transmissive film material 52 is substantially constant regardless of the wavelength of the incident light. In this description, the expression that a refractive index is "substantially constant" means that a difference among variations of the refractive index is within 0.1.

More specifically, in the wavelength range corresponding to blue light, the refractive index of the first light transmissive film material 51 is higher than the refractive index of the second light transmissive film material 52. In the wavelength range corresponding to red light, the refractive index of the first light transmissive film material 51 is lower than the refractive index of the second light transmissive film material 52. In the wavelength range corresponding to green light, the refractive index of the first light transmissive film material 51 and the refractive index of the second light transmissive film material 52 are equal to each other.

It is desirable that the refractive index of the first light transmissive film material 51 and the refractive index of the second light transmissive film material 52 are equal at a certain wavelength within a range from 490 nm to 580 nm of the incident light 100. It is further desirable that the refractive index of the first light transmissive film material 51 and the refractive index of the second light transmissive film material 52 are equal at a certain wavelength within a range from 500 nm to 550 nm of the incident light 100. The above-described structure can improve not only sensitivity but also color flooding reduction and spectroscopic properties (color rendering).

Next, results of simulation for color separation properties of the solid-state imaging device 1 according to the first embodiment are described with reference to FIGS. 3A to 3C.

Figure 3A:
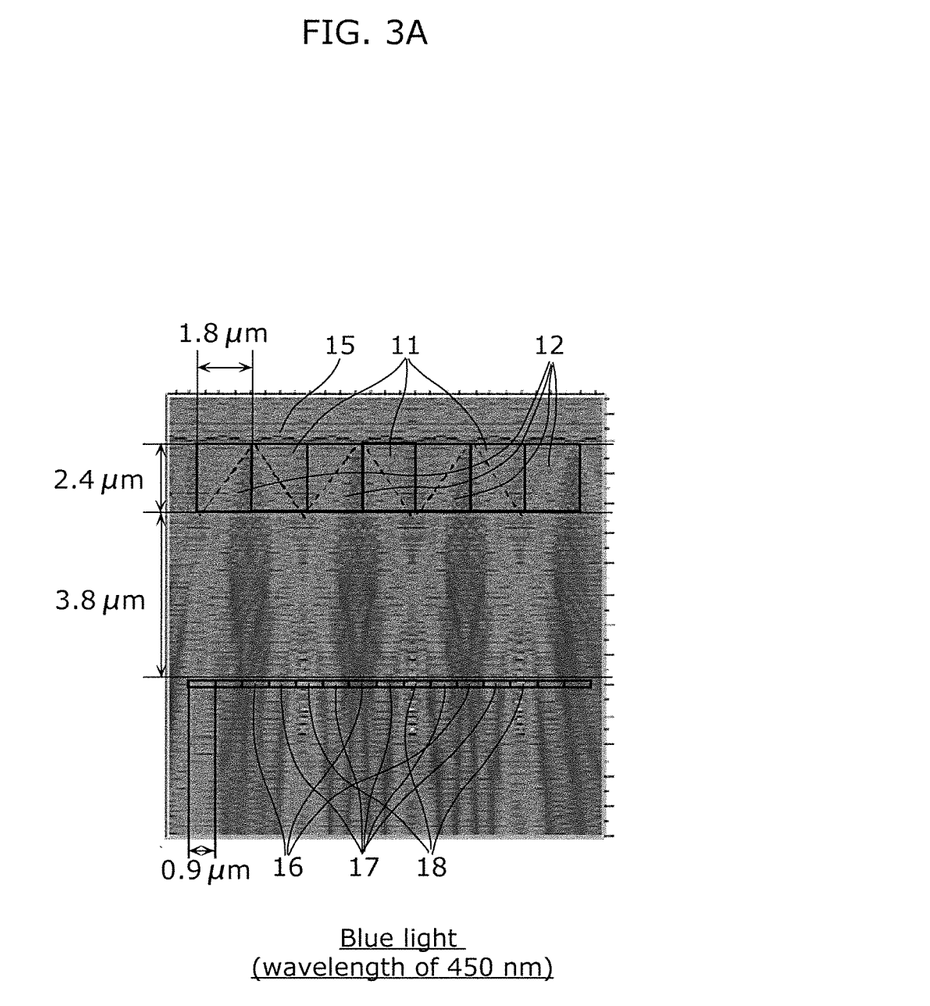
FIG. 3A is a diagram showing a traveling state of blue light in the solid-state imaging device according to the first embodiment.
Figure 3B:
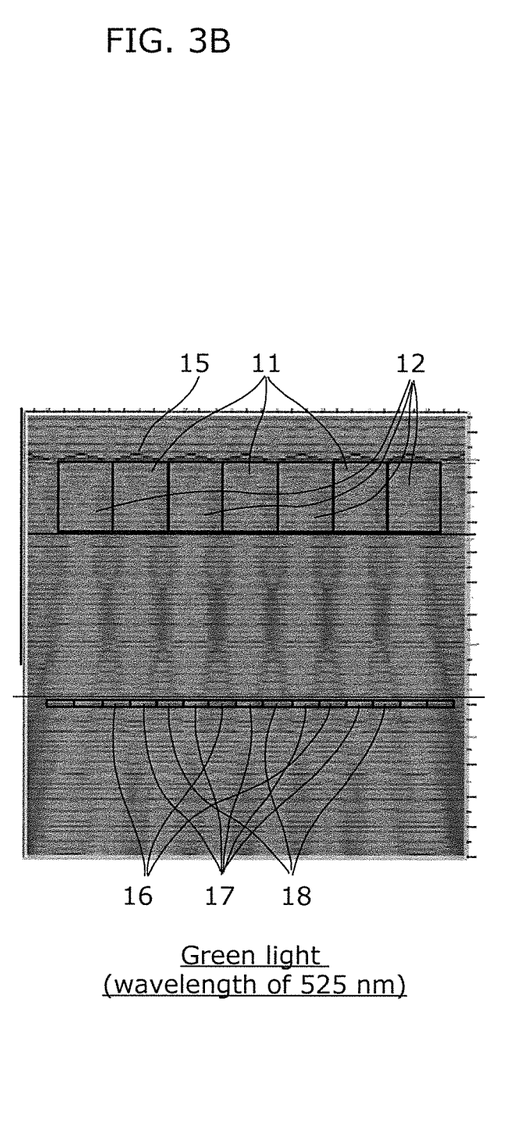
FIG. 3B is a diagram showing a traveling state of green light in the solid-state imaging device according to the first embodiment.
Figure 3C:
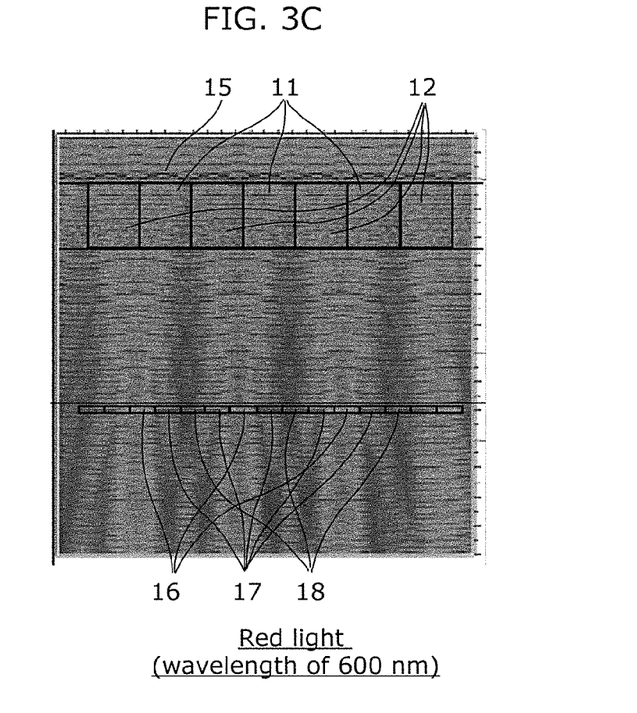
FIG. 3C is a diagram showing a traveling state of red light in the solid-state imaging device according to the first embodiment.

FIG. 3A is a diagram showing how blue light travels in the solid-state imaging device according to the first embodiment. FIG. 3B is a diagram showing how green light travels in the solid-state imaging device according to the first embodiment. FIG. 3C is a diagram showing how red light travels in the solid-state imaging device according to the first embodiment. More specifically, each of FIGS. 3A to 3C shows a result of performing wave-optical simulation on each color light using a finite element method. In each of FIGS. 3A to 3C, a wavelength of blue light is 450 nm, a wavelength of green light is 525 nm, and a wavelength of red light is 600 nm. Furthermore, a cell size in the solid-state imaging device in this case, in other words, a width of each of the first light-receiving elements 16, the second light-receiving elements 17, and the third light-receiving elements 18, is 0.9 µm. A width of each of the first dispersive elements 11 and the second dispersive elements 12 is double of the cell size, namely, 1.8 µm. A thickness of each of the first dispersive elements 11 and the second dispersive elements 12 is 2.4 µm. Furthermore, a distance from the bottom surface of each dispersive elements to the light-receiving elements is 3.8 µm.

FIG. 3A shows that when blue light is incident, blue light is bent in the first dispersive elements 11 and the second dispersive elements 12 to reach the third light-receiving elements 18. Furthermore, FIG. 3B shows that when green light is incident, the green light is not bent in passing through the first dispersive elements 11 and the second dispersive elements 12, so as to reach the second light-receiving elements 17 as it is collected as the incident light by the microlenses 15. Furthermore, FIG. 3C shows that when red light is incident, the red light is bent in the first dispersive elements 11 and the second dispersive elements 12 to reach the first light-receiving elements 16.

Figure 4A:
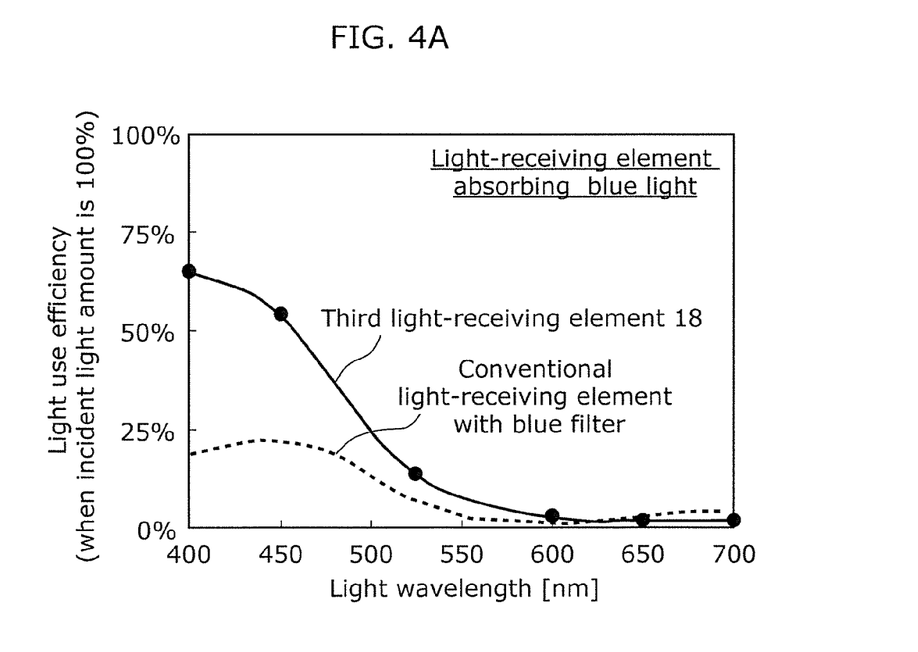
FIG. 4A is a graph plotting light use efficiency of a light-receiving element that absorbs blue light, which is obtained by wave-optical simulation on blue light.
Figure 4B:
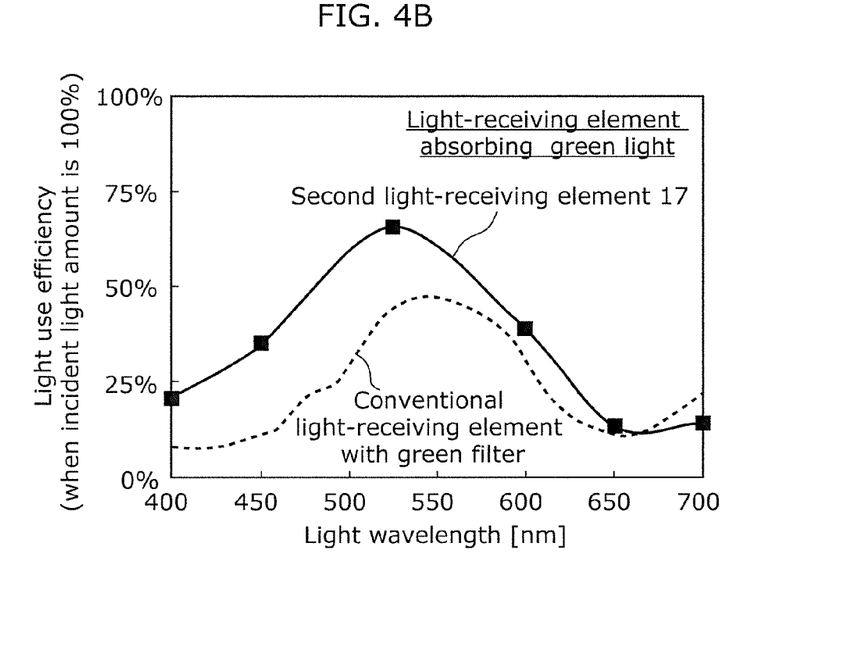
FIG. 4B is a graph plotting light use efficiency of a light-receiving element that absorbs green light, which is obtained by wave-optical simulation on green light.
Figure 4C:
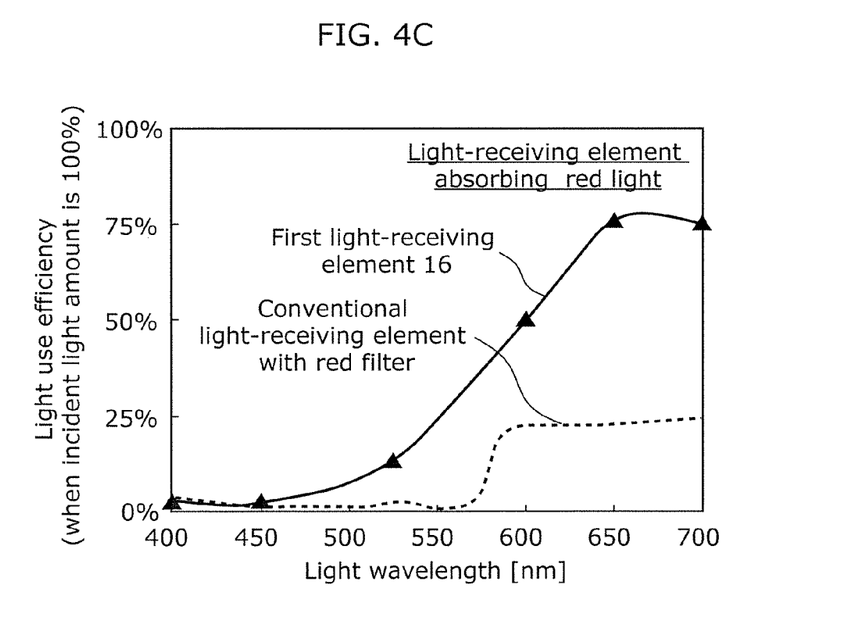
FIG. 4C is a graph plotting light use efficiency of a light-receiving element that absorbs red light, which is obtained by wave-optical simulation on red light

Each of FIGS. 4A to 4C is a graph plotting light use efficiency of each light-receiving element that absorbs a corresponding color. The data of light use efficiency is obtained from the simulation results seen in FIGS. 3A to 3C. More specifically, in each of FIGS. 4A, 4B, and 4C, in each of the light-receiving elements that absorb blue light, green light, and red light, respectively, the horizontal axis represents a wavelength (nm) of incident light and the vertical axis represents light use efficiency (%). For the light use efficiency (%) along the vertical axis, 100% means using of all the incident light. A curve shown by a solid line represents light use efficiency of a corresponding light-receiving element in the solid-state imaging device 1 according to the first embodiment. On the other hand, a curve shown by a broken line represents light use efficiency of a corresponding light-receiving element in the conventional solid-state imaging device having absorptive color filters.

As seen in each of FIGS. 4A to 4C, regarding the light use efficiency of the solid-state imaging device 1 according to the first embodiment, in a wavelength range with a high light use efficiency, the high light use efficiency ranges from approximately 65% to approximately 75%. The result shows that the light use efficiency of the solid-state imaging device 1 is approximately three times higher than that of the conventional solid-state imaging device with absorptive color filters. Here, since the conventional solid-state imaging device has green pixels approximately twice as much as any other colors, the light use efficiency of the solid-state imaging device 1 for green light is less effective than the other color pixels but is approximately 1.5 times higher than that of the conventional solid-state imaging device.

Figure 5A:
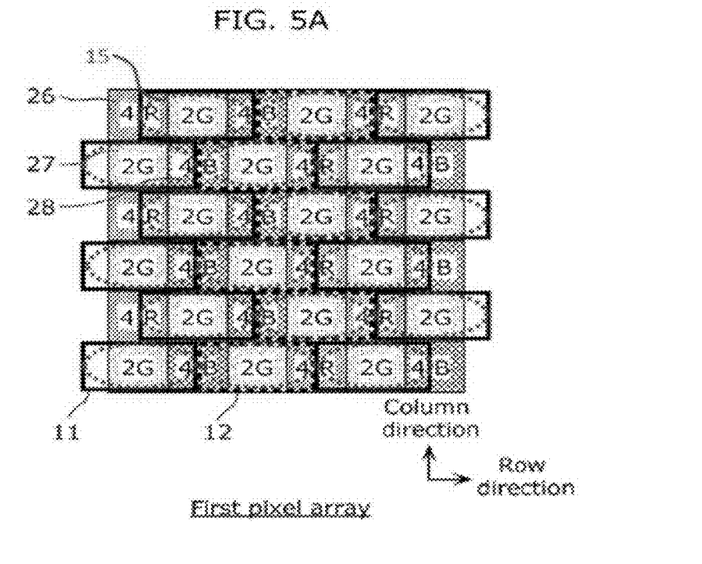
FIG. 5A is a plan view of a first pixel array in the solid-state imaging device according to the first embodiment.
Figure 5B:
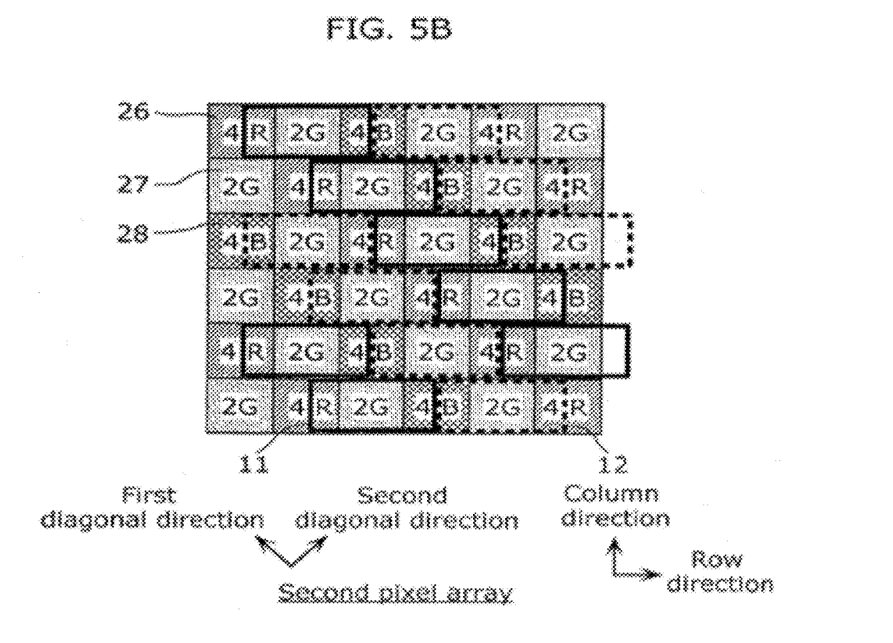
FIG. 5B is a plan view of a second pixel array in the solid-state imaging device according to the first embodiment.

FIG. 5A is a plan view of a first pixel array in the solid-state imaging device according to the first embodiment. FIG. 5B is a plan view of a second pixel array in the solid-state imaging device according to the first embodiment. In each of the first pixel array illustrated in FIG. 5A and the second pixel array illustrated in FIG. 5B, first pixels 26 that receive red light, the second pixels 27 that receive green light, and third pixels 28 that receive blue light are arranged in rows and columns. At least one of a first dispersive element 11 and a second dispersive element 12 each being rectangular in the planar view is disposed over each of the pixels 26, 27, and 28. Here, the "rectangular" refers to not only oblong or square, but also a shape with rounded corners caused by restrictions on design or manufacturing.

In each of the first pixel array and the second pixel array, the microlens 15 (not illustrated) having a substantially elliptical or substantially rectangular shape in the planar view is disposed above each of the first dispersive elements 11 and the second dispersive elements 12. If the microlens is elliptical, the longest diameter of the microlens is equal to a length of a first side of the substantially rectangular shape of each of the first dispersive elements 11 and the second dispersive elements 12. In addition, the shortest diameter of the microlens is equal to a length of a second side of the substantially rectangular shape of each of the first dispersive elements 11 and the second dispersive elements 12. Here, the first side is perpendicular to the second side. If the microlens 15 is substantially rectangular, the shape of the microlens 15 is substantially the same as the shape of each of the first dispersive elements 11 and the second dispersive elements 12 in the planar view. Here, the expression "substantially the same" means that a difference in the shape which has occurred in manufacturing is included.

In the first pixel array, the first pixels 26 are arranged in zigzags along a column direction of FIG. 5A to be adjacent to each other in a diagonal direction of the pixels. In the same manner, the third pixels 28 are also arranged in zigzags along the column direction of FIG. 5A to be adjacent to each other in the diagonal direction. In this structure, each of a resolution in the diagonal direction of the pixels and a resolution in the column direction of FIG. 5A is higher than a resolution in the row direction of FIG. 5A. This is because the first pixels 26 are arranged in every fourth column along the row direction, and the third pixels 28 are also arranged in every fourth column along the row direction, so that the resolution in the row direction is relatively lower than the resolutions in other directions.

Each of the first dispersive elements 11 and the second dispersive elements 12 is disposed to cover an entire second pixel 27, a part of a first pixel 26, and a part of a third pixel 28 in the planar view. Furthermore, the first dispersive elements 11 and the second dispersive elements 12 are alternately arrayed in each row.

In the second pixel array, the first pixels 26 are arranged to be adjacent to each other in a first diagonal direction of FIG. 5B, and the third pixels 28 are also arranged to be adjacent to each other in the first diagonal direction of FIG. 5B. In this structure, each of a resolution in the row direction, a resolution in the column direction, and a resolution in the first diagonal direction in FIG. 5B is higher than a resolution in a second diagonal direction in FIG. 5B. This is because the first pixels 26 are arranged in every other row along a second diagonal direction and the third pixels 28 are also arranged in every other row along the second diagonal direction, so that the resolution in the second diagonal direction is relatively lower than resolutions in other directions.

In the same manner as the first pixel array, in the second pixel array, each of the first dispersive elements 11 and the second dispersive elements 12 is arranged to cover an entire second pixel 27, a part of a first pixel 26, and a part of a third pixel 28 in the planar view. Furthermore, the first dispersive elements 11 and the second dispersive elements 12 are alternately arrayed in each row.

It is also possible in FIG. 5B that the first pixels 26 are adjacent to each other in the second diagonal direction and the third pixels 28 are also adjacent to each other in the second diagonal direction. In this structure, each of a resolution in the row direction, a resolution in the column direction, and a resolution in the second diagonal direction in FIG. 5B is higher than a resolution in the first diagonal direction in FIG. 5B.

Second Embodiment

Figure 6:
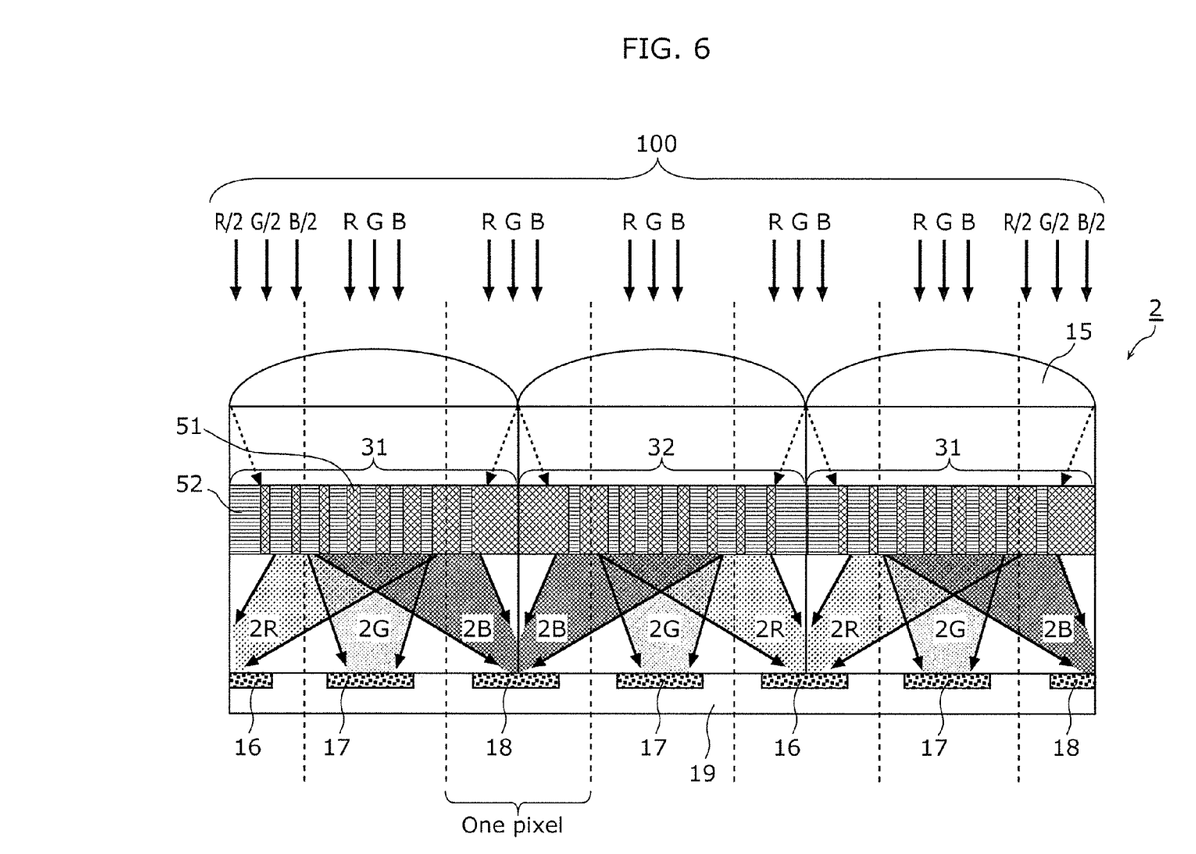
FIG. 6 is a cross-sectional view of a plurality of pixels arrayed in a solid-state imaging device according to a second embodiment.

FIG. 6 is a cross-sectional view of a plurality of pixels arrayed in a solid-state imaging device according to the second embodiment. The same reference numerals in the first embodiment are assigned to the substantially identical constituent elements in the second embodiment, so that the identical constituent elements may not be explained again below. The solid-state imaging device 2 according to the second embodiment differs from the solid-state imaging device 1 according to the first embodiment in that the first dispersive elements 11 and the second dispersive elements 12 are replaced by third dispersive elements 31 and fourth dispersive elements 32. In the solid-state imaging device 2 according to the second embodiment, each of the third dispersive elements 31 and the fourth dispersive elements 32 includes the first light transmissive film materials 51 and the second light transmissive film materials 52. More specifically, each of the third dispersive elements 31 and the fourth dispersive elements 32 includes a plurality of divided portions each having a width shorter than the wavelength of the incident light 100. The divided portions include first portions and second portions. Each of the first portions is the first light transmissive film material 51. Each of the second portions is the second light transmissive film material 52. The first light transmissive film materials 51 and the second light transmissive film materials 52 are the same materials as used in the first embodiment.

In each of the third dispersive elements 31 and the fourth dispersive elements 32, volume occupation ratios of the first light transmissive film materials 51 and the second light transmissive film materials 52 vary in the direction parallel to the light-incident surface. More specifically, volume occupation ratios of the first light transmissive film materials 51 in each dispersive element gradually increase from one end of the dispersive element towards the other end of the dispersive element which is opposite the one end in the direction parallel to the light-receiving surface, while volume occupation ratios of the second light transmissive film materials 52 in the dispersive element gradually increase from the other end towards the one end in the direction parallel to the light-receiving surface. In FIG. 6, the volume occupation ratio distribution of the first light transmissive film materials 51 monotonically decreases from one end of the dispersive element towards the other end of the dispersive element which is opposite the one end in the direction parallel to the light-receiving surface, while the volume occupation ratio distribution of the second light transmissive film materials 52 monotonically increases from the one end towards the other end in the direction parallel to the light-receiving surface.

Figure 7A:
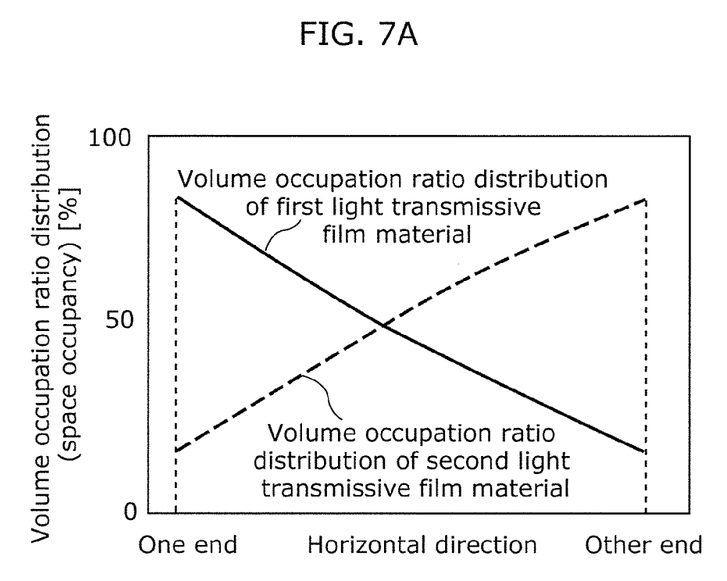
FIG. 7A is a graph plotting volume occupation ratio distribution of a first light transmissive film material and volume occupation ratio distribution of a second light transmissive film material regarding a fourth dispersive element according to the second embodiment.

FIG. 7A is a graph plotting volume occupation ratio distribution of the first light transmissive film materials and volume occupation ratio distribution of the second light transmissive film materials in the fourth dispersive element according to the second embodiment. Here, the volume occupation ratio distribution refers to a space occupancy of each of the first light transmissive film materials 51 and the second light transmissive film materials 52 in each of the dispersive elements. In each of the fourth dispersive elements 32 having the volume occupation ratio seen in FIG. 7A, for red light a refractive index of the second light transmissive film materials 52 is higher than a refractive index of the first transmissive film materials 51, so that red light in the incident light is refracted towards a portion with a higher volume occupation ratio distribution of the second light transmissive film materials 52 in the dispersive element according to Snell's law. For blue light, a refractive index of the first light transmissive film materials 51 is higher than a refractive index of the second light transmissive film materials 52, so that blue light in the incident light is refracted towards a portion with a higher volume occupation ratio distribution of the first light transmissive film materials 51 in the dispersive element according to Snell's law. For green light, the first light transmissive film materials 51 and the second light transmissive film materials 52 have substantially the same refractive indices, so that green light in the incident light is not refracted but travels straightforward.

Figure 7B:
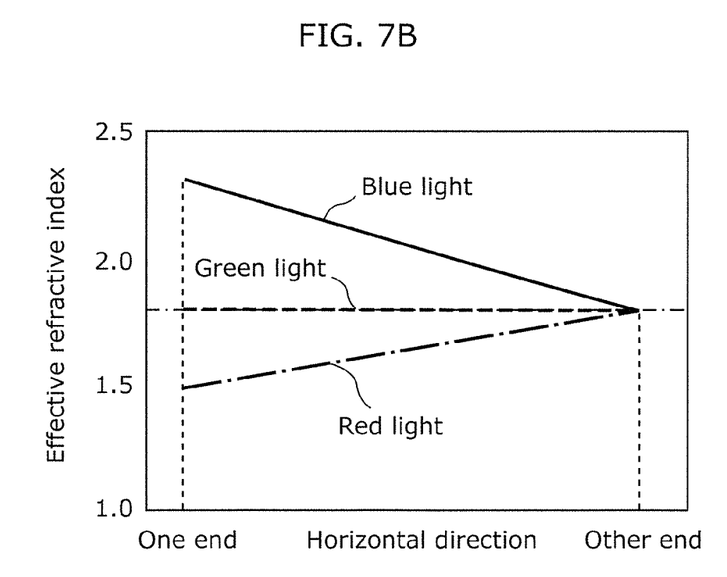
FIG. 7B is a graph plotting effective refractive index distribution of the fourth dispersive element according to the second embodiment.

FIG. 7B is a graph plotting effective refractive index distribution of the fourth dispersive element according to the second embodiment. The effective refractive index distribution refers to distribution of refractive indices each of which is obtained by averaging refractive indices in a portion having a width substantially equal to the wavelength of light, in a structure including sub-structures each having a width shorter than the wavelength of light.

If each of the fourth dispersive elements has the volume occupation ratio distribution as seen in FIG. 7A, as a volume occupation ratio distribution of the first light transmissive film materials 51 is higher, an effective refractive index for blue light increases. Furthermore, as a volume occupation ratio distribution of the second light transmissive film materials 52 is higher, an effective refractive index for red light increases. For green light, the volume occupation ratio of the first light transmissive film materials 51 and the volume occupation ratio of the second light transmissive film materials 52 are substantially equal, so that the effective refractive index distribution hardly varies for green light.

With the above-described structure, in the same manner as described in the first embodiment, both red light refracted in a third dispersive element 31 and red light refracted in a fourth dispersive element 32 reach the same first light-receiving element 16. Furthermore, both blue light refracted in a third dispersive element 31 and blue light refracted in a fourth dispersive element 32 reach the same third light-receiving element 18. The light dispersion caused by refraction reduces a loss in light collection in comparison with light dispersion caused by diffraction. This is because while diffraction causes light distribution up to high-order zones, such as zero order, first order, second order, third order, . . . , refraction without such high-order zones can reduce such a loss in light collection caused by the high-order zones. As the light collection loss is reduced, light use efficiency is improved and eventually sensitivity of the solid-state imaging device 2 according to the present embodiment is improved. Furthermore, an angle for color separation can also be controlled by a difference in refractive index between dispersive elements. If a distance between each pair of adjacent light-receiving elements is equal, setting a larger angle for color separation results in a shorter distance between a light-receiving element and a dispersive element. In short, the height of the solid-state imaging device 2 can be decreased. As described above, the structure having the dispersive elements and the microlenses as illustrated in FIG. 6 allows all the incident light 100 to be guided to the light-receiving elements, thereby significantly increasing sensitivity of the solid-state imaging device 2 in comparison with the conventional solid-state imaging device having absorptive color filters.

Although the solid-state imaging device according to the present disclosure has been described based on the above embodiments, the solid-state imaging device according to the present disclosure is not limited to the embodiments. Those skilled in the art will be readily appreciate that various modifications and combinations of the constituent elements in the different embodiments are possible without materially departing from the novel teachings and advantages of the present disclosure. Accordingly, all such modifications and combinations are intended to be included within the scope of the present disclosure.

The solid-state imaging device according to the present disclosure can be used in digital still cameras, digital video cameras, mobile phones with camera function, and the like, and therefore has industrial applicability.

The invention claimed is:

1. A solid-state imaging device comprising:
   a plurality of light-receiving elements each of which photoelectrically converts incident light; and
   a plurality of dispersive elements disposed on a light-incident side of the light-receiving elements,
   wherein each of the dispersive elements includes:
   a first light transmissive film material; and
   a second light transmissive film material with a property of having a refractive index that is lower than a refractive index of the first light transmissive film material in a first wavelength range of the incident light and higher than the refractive index of the first light transmissive film material in a second wavelength range of the incident light, the second wavelength range being longer in wavelength than the first wavelength range,
   a volume occupation ratio of the first light transmissive film material in the each of the dispersive elements increases from one end of the each of the dispersive elements towards an other end of the each of the dispersive elements in a direction parallel to a light-receiving surface of the light-receiving elements, while a volume occupation ratio of the second light transmissive film material in the each of the dispersive elements increases from the other end towards the one end in the direction, the other end being opposite the one end,
   each of the dispersive elements includes first plural portions each comprising the first light transmissive film material and second plural portions each comprising the second light transmissive film material,
   the first plural portions and the second plural portions are disposed alternately in a direction parallel to the light-receiving surface, and
   each of the first plural portions and the second plural portions has a width shorter than a wavelength of the incident light.

2. The solid-state imaging device according to claim 1,
   wherein the dispersive elements include a first dispersive element and a second dispersive element which are adjacent to each other in the direction, and
   the first dispersive element and the second dispersive element are arranged to cause (a) a set of the first light transmissive film material and the second light transmissive film material in the first dispersive element and (b) a set of the first light transmissive film material and the second light transmissive film material in the second dispersive element adjacent to the first dispersive element are symmetric with respect to a boundary between the first dispersive element and the second dispersive element, the boundary being a plane including a normal of the light-receiving surface.

3. The solid-state imaging device according to claim 1,
   wherein as a wavelength of the incident light is longer, the refractive index of the first light transmissive film material decreases.

4. The solid-state imaging device according to claim 1,
   wherein the first light transmissive film material is stacked on a light-incident side of the second light transmissive film material.

5. The solid-state imaging device according to claim 1,
wherein the second light transmissive film material is stacked on a light-incident side of the first light transmissive film material.

6. The solid-state imaging device according to claim 1,
wherein each of the dispersive elements has a substantially rectangular shape when viewed from a normal direction of the light-receiving surface, and
the solid-state imaging device further comprises a microlens disposed for a corresponding one of the dispersive elements, the microlens having a substantially elliptical shape when viewed from the normal direction
wherein the microlens has a longest diameter equal to a length of a first side of the corresponding one of the dispersive elements, and a shortest diameter equal to a length of a second side of the corresponding one of the dispersive elements, and
the first side is perpendicular to the second side.

7. The solid-state imaging device according to claim 1,
wherein each of the dispersive elements has a substantially rectangular shape when viewed from a normal direction of the light-receiving surface, and
the solid-state imaging device further comprises a microlens disposed for a corresponding one of the dispersive elements, the microlens having a substantially rectangular shape when viewed from the normal direction.

8. The solid-state imaging device according to claim 1,
wherein the refractive index of the first light transmissive film material is equal to the refractive index of the second light transmissive film material at a wavelength within a range from 490 nm to 580 nm of a wavelength of the incident light.

9. The solid-state imaging device according to claim 1,
wherein the first light transmissive film material comprises indium tin oxide (ITO), and
the second light transmissive film material comprises aluminum oxide ($Al_2O_3$).

10. A solid-state imaging device comprising:
a plurality of light-receiving elements each of which photoelectrically converts incident light, the plurality of light receiving elements including a first light receiving element; and
a plurality of dispersive elements disposed on a light-incident side of the light-receiving elements, the plurality of dispersive elements including a first dispersive element and a second dispersive element adjacent to the first dispersive element,
wherein each of the dispersive elements includes:
a first light transmissive film material; and
a second light transmissive film material with a property of having a refractive index that is lower than a refractive index of the first light transmissive film material in a first wavelength range of the incident light and higher than the refractive index of the first light transmissive film material in a second wavelength range of the incident light, the second wavelength range being longer in wavelength than the first wavelength range,
a volume occupation ratio of the first light transmissive film material in the each of the dispersive elements increases from one end of the each of the dispersive elements towards an other end of the each of the dispersive elements in a direction parallel to a light-receiving surface of the light-receiving elements, while a volume occupation ratio of the second light transmissive film material in the each of the dispersive elements increases from the other end towards the one end in the direction, the other end being opposite the one end, and
the first light-receiving element receives both a light of a first wavelength range from the first dispersive element and a light of the first wavelength range from the second dispersive element.

11. The solid-state imaging device according to claim 10,
wherein the dispersive elements include a first dispersive element and a second dispersive element which are adjacent to each other in the direction, and
the first dispersive element and the second dispersive element are arranged to cause (a) a set of the first light transmissive film material and the second light transmissive film material in the first dispersive element and (b) a set of the first light transmissive film material and the second light transmissive film material in the second dispersive element adjacent to the first dispersive element are symmetric with respect to a boundary between the first dispersive element and the second dispersive element, the boundary being a plane including a normal of the light-receiving surface.

12. The solid-state imaging device according to claim 10,
wherein as a wavelength of the incident light is longer, the refractive index of the first light transmissive film material decreases.

13. The solid-state imaging device according to claim 10,
wherein the first light transmissive film material is stacked on a light-incident side of the second light transmissive film material.

14. The solid-state imaging device according to claim 10,
wherein the second light transmissive film material is stacked on a light-incident side of the first light transmissive film material.

15. The solid-state imaging device according to claim 10,
wherein each of the dispersive elements includes first plural portions each comprising the first light transmissive film material and second plural portions each comprising the second light transmissive film material,
the first plural portions and the second plural portions are disposed alternately in a direction parallel to the light-receiving surface, and
each of the first plural portions and the second plural portions has a width shorter than a wavelength of the incident light.

16. The solid-state imaging device according to claim 10,
wherein each of the dispersive elements has a substantially rectangular shape when viewed from a normal direction of the light-receiving surface, and
the solid-state imaging device further comprises a microlens disposed for a corresponding one of the dispersive elements, the microlens having a substantially elliptical shape when viewed from the normal direction.

17. The solid-state imaging device according to claim 10,
wherein each of the dispersive elements has a substantially rectangular shape when viewed from a normal direction of the light-receiving surface, and
the solid-state imaging device further comprises a microlens disposed for a corresponding one of the dispersive elements, the microlens having a substantially rectangular shape when viewed from the normal direction.

18. The solid-state imaging device according to claim 10,
wherein the refractive index of the first light transmissive film material is equal to the refractive index of the second light transmissive film material at a wavelength within a range from 490 nm to 580 nm of a wavelength of the incident light.

19. The solid-state imaging device according to claim 10,
wherein the first light transmissive film material comprises indium tin oxide (ITO), and
the second light transmissive film material comprises aluminum oxide ($Al_2O_3$).

* * * * *